(12) United States Patent
Pan et al.

(10) Patent No.: US 12,176,615 B2
(45) Date of Patent: Dec. 24, 2024

(54) ELECTRONIC DEVICE AND MANUFACTURING METHOD THEREOF

(71) Applicant: KORE SEMICONDUCTOR CO., LTD., Qingdao (CN)

(72) Inventors: Ying-Chieh Pan, Qingdao (CN); Hsiang-Hua Lu, Qingdao (CN); Chi-Ting Huang, Qingdao (CN)

(73) Assignee: KORE SEMICONDUCTOR CO., LTD., Qingdao (CN)

( * ) Notice: Subject to any disclaimer, the term of this patent is extended or adjusted under 35 U.S.C. 154(b) by 135 days.

(21) Appl. No.: 18/052,341

(22) Filed: Nov. 3, 2022

(65) Prior Publication Data

US 2023/0132846 A1    May 4, 2023

(30) Foreign Application Priority Data

Nov. 4, 2021  (CN) .......................... 202111299279.4

(51) Int. Cl.
| | | |
|---|---|---|
| *H01Q 19/10* | (2006.01) | |
| *H01P 3/08* | (2006.01) | |
| *H05K 1/02* | (2006.01) | |
| *H05K 3/30* | (2006.01) | |

(52) U.S. Cl.
CPC ............. *H01Q 19/10* (2013.01); *H01P 3/081* (2013.01); *H05K 1/0243* (2013.01); *H05K 3/303* (2013.01)

(58) Field of Classification Search
CPC ........ H01Q 19/10; H01Q 1/40; H01Q 9/0457; H01Q 1/2283; H01Q 13/08; H01Q 1/12; H01Q 1/22; H01Q 15/14; H01P 3/081; H05K 1/0243; H05K 3/303; H05K 1/165; H05K 2201/10098; H05K 1/181
See application file for complete search history.

(56) References Cited

U.S. PATENT DOCUMENTS

| 2020/0161766 A1* | 5/2020 | Liu ........................ H01Q 9/045 |
| 2021/0135368 A1* | 5/2021 | Rogers ................. H01Q 9/0457 |

* cited by examiner

*Primary Examiner* — Daniel D Chang
(74) *Attorney, Agent, or Firm* — Nicholas Mesiti, Esq.; HESLIN ROTHENBERG FARLEY & MESITI P.C.

(57) ABSTRACT

An electronic device is provided, and the manufacturing method of which is to stack a carrier structure on a circuit board having a reflector via a plurality of conductive elements, dispose a micro strip and an antenna layer communicatively connected to the reflector respectively on opposite sides of the carrier structure, dispose an antenna spacer on the carrier structure, cover the antenna spacer with an encapsulation layer, and form an antenna portion communicatively connected to the antenna layer on the encapsulation layer. Therefore, a better antenna performance can be obtained by disposing the micro strip on the bottom layer of the carrier structure and disposing the antenna layer on the top layer of the carrier structure.

20 Claims, 5 Drawing Sheets

ELECTRONIC DEVICE AND MANUFACTURING METHOD THEREOF

BACKGROUND

Technical Field

The present disclosure relates to an electronic device, and more particularly, to an electronic device with an antenna module and a manufacturing method thereof.

Description of Related Art

The current multimedia content has a larger amount of file data due to the improvement of image quality, so the bandwidth of wireless transmission also needs to be larger, thereby resulting in the fifth generation of wireless transmission (5G). In addition, due to the high transmission frequency of 5G, the size requirements of the related wireless communication modules are also high.

In the conventional antenna module, when the antenna structure is planar, the electromagnetic radiation characteristics between the antenna structure and the electronic elements will be limited, so that it is difficult to improve the antenna performance. Therefore, how to overcome the above-mentioned drawbacks of the prior art has become an urgent issue to be overcome in the current industry.

SUMMARY

In view of the various deficiencies of the prior art, the present disclosure provides an electronic device, comprising: a circuit board; a carrier structure having a first side and a second side opposing the first side, wherein the carrier structure is stacked on the circuit board via a plurality of conductive elements with the second side thereof an antenna layer formed on the first side of the carrier structure; a micro strip disposed on the second side of the carrier structure, wherein a position of the antenna layer corresponds to a position of the micro strip; an encapsulation layer formed on the first side of the carrier structure; an antenna portion disposed on the encapsulation layer and communicatively connected to the antenna layer; an antenna spacer disposed on the first side of the carrier structure by corresponding to the position of the antenna layer and located between the antenna layer and the antenna portion, wherein the antenna spacer is covered by the encapsulation layer; and a reflector disposed on a side of the circuit board facing the carrier structure and communicatively connected to the antenna layer.

The present disclosure further provides a method of manufacturing an electronic device, comprising: providing a carrier structure having a first side and a second side opposing the first side, wherein the first side of the carrier structure has an antenna layer formed thereon, and a micro strip is disposed on the second side of the carrier structure, and wherein a position of the antenna layer corresponds to a position of the micro strip; disposing an antenna spacer on the first side of the carrier structure; forming an encapsulation layer on the first side of the carrier structure for the encapsulation layer to cover the antenna spacer; bonding an antenna portion communicatively connected to the antenna layer on the encapsulation layer on the first side of the carrier structure; and disposing the carrier structure onto a circuit board having a reflector with the second side of the carrier structure via a plurality of conductive elements, wherein the reflector is disposed on a side of the circuit board facing the carrier structure and communicatively connected to the antenna layer.

In the aforementioned electronic device and method, the present disclosure further comprises forming a plurality of electrical contact pads on the second side of the carrier structure, wherein the plurality of conductive elements are only disposed on a portion of the plurality of electrical contact pads.

In the aforementioned electronic device and method, the antenna layer is a coplanar waveguide, wherein a width of the reflector is greater than a width of the coplanar waveguide, and wherein the antenna layer is communicatively connected to the reflector via the plurality of conductive elements and a portion of a plurality of electrical contact pads.

In the aforementioned electronic device and method, the antenna portion comprises an antenna body communicatively connected to the antenna layer, wherein a position of the antenna body corresponds to a position of the antenna spacer, and wherein a position of the reflector corresponds to the position of the antenna layer.

In the aforementioned electronic device and method, the present disclosure further comprises disposing an electronic element on the first side of the carrier structure, wherein the encapsulation layer covers the electronic element when the encapsulation layer is formed on the first side of the carrier structure.

As can be seen from the above, in the electronic device and the manufacturing method thereof of the present disclosure, a better antenna performance can be obtained by disposing the micro strip on the second side of the carrier structure and disposing the conductive elements only on a portion of the electrical contact pads.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "on," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1:
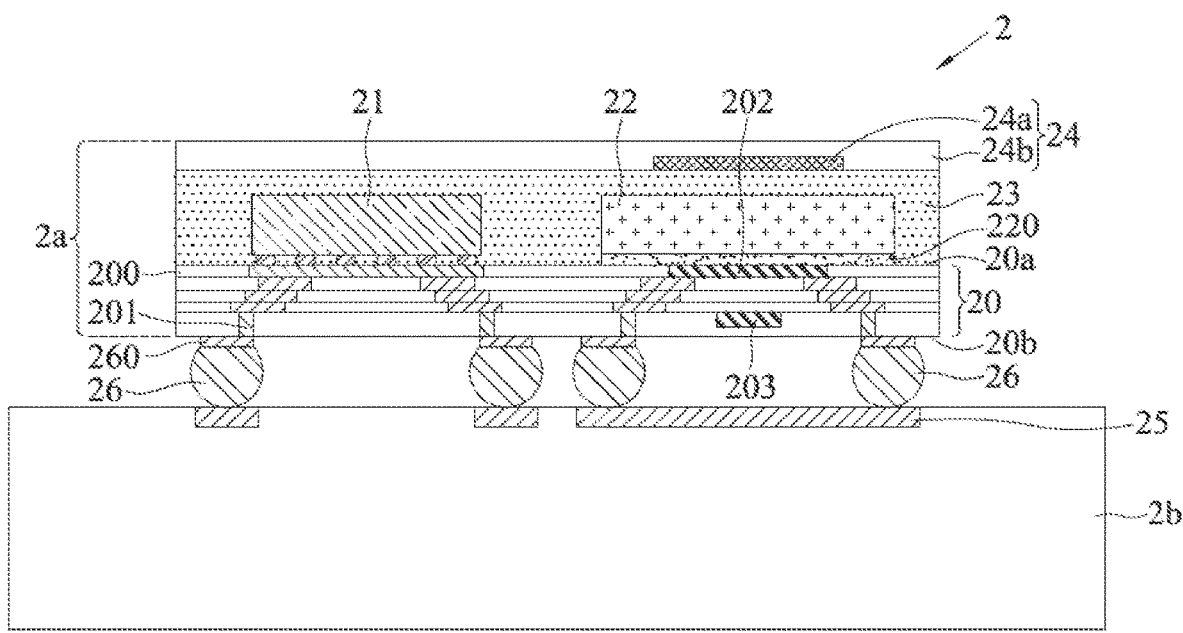
FIG. 1 is a schematic cross-sectional view of an electronic device according to the present disclosure.

FIG. 1 is a schematic cross-sectional view of an electronic device 2 according to the present disclosure. As shown in FIG. 1, the electronic device 2 at least includes: an antenna module 2a, and a circuit board 2b provided with a reflector 25, wherein the antenna module 2a includes a carrier structure 20, an electronic element 21, an antenna spacer 22, an encapsulation layer 23 and an antenna portion 24.

The carrier structure 20 has a first side 20a and a second side 20b opposing the first side 20a, wherein at least one antenna layer 202 is configured on the first side 20a to serve as a coplanar waveguide (CPW), and a micro strip 203 is configured on the second side 20b, so that the position of the antenna layer 202 corresponds to the position of the micro strip 203, such that the antenna layer 202 covers the micro strip 203, and wherein a plurality of conductive elements 26 are disposed on the second side 20b, so that the antenna module 2a is stacked on the circuit board 2b via the conductive elements 26. The conductive elements 26 can be ball grid array connectors, solder balls, metal pillars, micro bumps, or other similar elements, and the material for forming the conductive elements 26 may be composed of solder, copper, aluminum, gold, nickel, silver, palladium, tin, and combinations of the foregoing.

The electronic element 21 is disposed on the first side 20a of the carrier structure 20 and is electrically connected to the carrier structure 20.

The antenna spacer 22 is also disposed on the first side 20a of the carrier structure 20, and the antenna spacer 22 is disposed separately from the electronic element 21.

The encapsulation layer 23 is disposed on the first side 20a of the carrier structure 20 and covers the electronic element 21 and the antenna spacer 22.

The antenna portion 24 has an antenna body 24a covered by an insulating material, is disposed on the encapsulation layer 23, and communicatively connects with the carrier structure 20.

The reflector 25 is disposed on a surface of the circuit board 2b facing the second side 20b of the carrier structure 20 (that is, the reflector 25 is disposed between the second side 20b of the carrier structure 20 and the circuit board 2b), and communicatively connects with the carrier structure 20.

Figure 2:
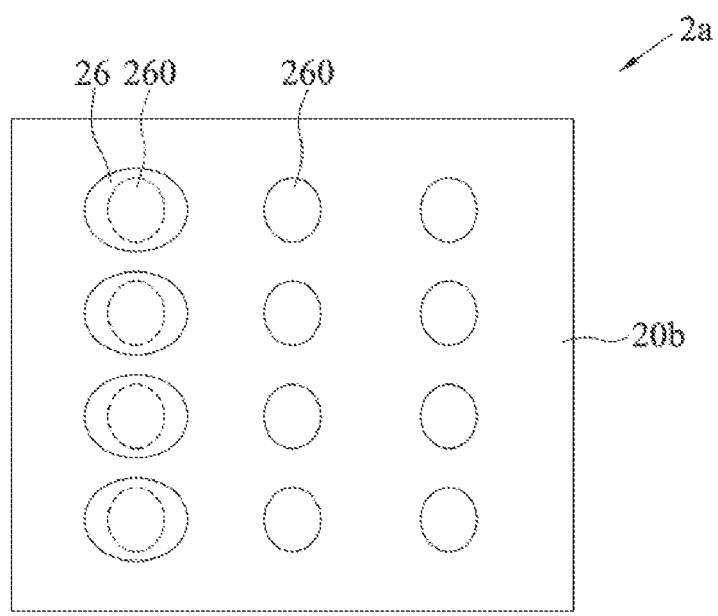
FIG. 2 is a schematic bottom view of an antenna module of the electronic device according to the present disclosure.

In one embodiment, in the electronic device 2 of the present disclosure, a plurality of electrical contact pads 260 can be formed on the second side 20b of the carrier structure 20 to bond the conductive elements 26, and the conductive elements 26 are only arranged on a portion of the electrical contact pads 260, such as arranged in a row as shown in FIG. 2 (but not limited thereto), thereby improving the gain of the electronic device 2 of the present disclosure.

Therefore, in the electronic device 2 of the present disclosure, the position of the micro strip 203 is set in the second side 20b of the carrier structure 20, so as to increase the length of the micro strip 203. Compared with the prior art of disposing the micro strip on the top surface of the circuit board, the electronic device 2 of the present disclosure can greatly improve the performance, for example, the bandwidth is improved by about 7.4 GHz, the center frequency is improved by about 60 GHz and/or the gain is improved by about 6.7 dB.

Furthermore, the antenna layer 202 (CPW) of the electronic device 2 of the present disclosure is connected to the reflector 25 via the conductive elements 26 and a portion of the electrical contact pads 260, so that the CPW is grounded. Compared with the prior art of connecting all solder balls to the circuit board, the electronic device 2 of the present disclosure can greatly improve the performance, for example, the antenna gain of the present disclosure can be improved (about 5 dB).

FIG. 3A to FIG. 3G are schematic cross-sectional views illustrating a method of manufacturing the electronic device 2 according to the present disclosure.

Figure 3A:
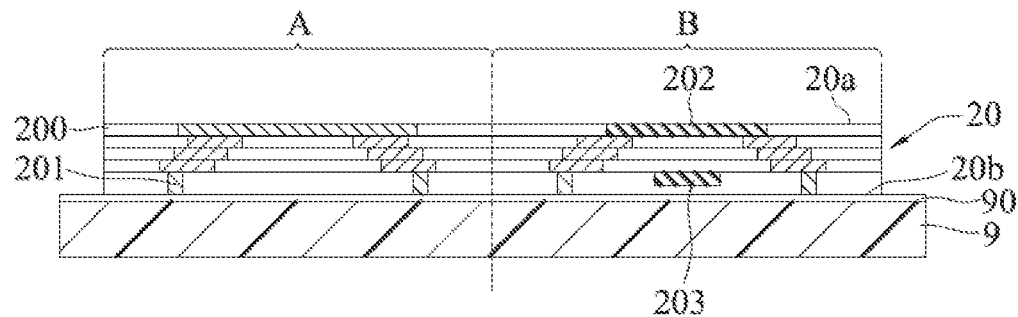
FIG. 3A to FIG. 3G are schematic cross-sectional views illustrating a method of manufacturing the electronic device according to the present disclosure.

As shown in FIG. 3A, a carrier structure 20 disposed on a support member 9 is provided, and the carrier structure 20 has a first side 20a and a second side 20b opposing the first side 20a, wherein the first side 20a is defined with a first area A and a second area B adjacent to the first area A, and the carrier structure 20 is bonded onto the support member 9 with the second side 20b thereof.

In an embodiment, the carrier structure 20 is composed of an insulating layer (dielectric layer) 200 and a circuit layer 201 such as a fan-out redistribution layer (RDL), wherein the material for forming the circuit layer 201 may be copper or gold, etc., and the material for forming the insulating layer 200 may be a dielectric material such as polybenzoxazole (PBO), polyimide (PI), prepreg (PP), etc.

Furthermore, the carrier structure 20 is configured with at least one antenna layer 202 in the uppermost insulating layer 200 (i.e., the top layer) for serving as a coplanar waveguide (CPW), and the circuit layer 201 in the lowermost insulating layer 200 (e.g., the PI layer) (i.e., the bottom layer) of the carrier structure 20 has a micro strip 203, so that the position of the antenna layer 202 corresponds to the position of the micro strip 203, such that the antenna layer 202 covers the micro strip 203.

In addition, the support member 9 can be, for example, a plate made of semiconductor material (such as silicon or glass), and the carrier structure 20 can be fixed on the support member 9 via an adhesive material such as an adhesive layer 90.

Figure 3B:
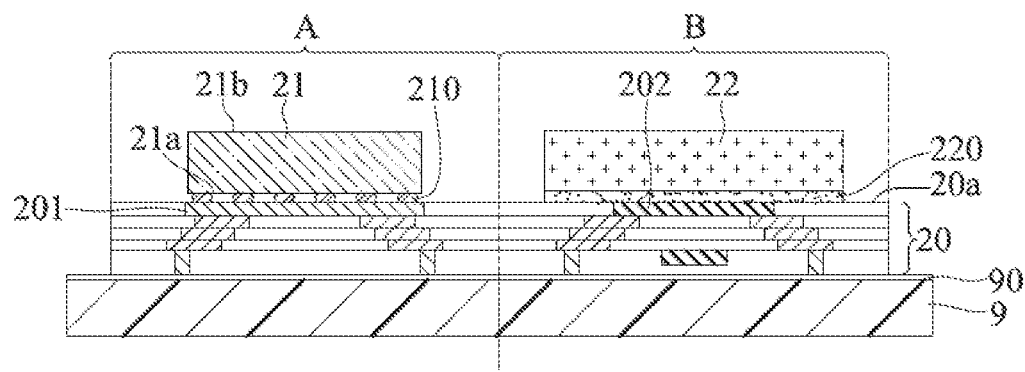

As shown in FIG. 3B, at least one electronic element 21 is disposed on the first area A of the first side 20a of the carrier structure 20, and at least one antenna spacer 22 is disposed on the second area B of the first side 20a of the carrier structure 20, wherein the antenna spacer 22 is disposed separately from the electronic element 21.

In an embodiment, the electronic element 21 is an active element, a passive element, or a combination of the active element and the passive element, wherein the active element is such as a semiconductor chip, and the passive element is such as a resistor, a capacitor, or an inductor. In an embodiment, the electronic element 21 is a semiconductor chip, such as a radio-frequency chip (radio-frequency integrated circuits [RFIDs]), which has an active surface 21a and an inactive surface 21b opposing the active surface 21a, wherein the electronic element 21 is disposed on the circuit layer 201 in a flip-chip manner via a plurality of conductive bumps 210 such as solder material and is electrically connected to the circuit layer 201; alternatively, the electronic element 21 can be electrically connected to the circuit layer 201 in a wire-bonding manner via a plurality of bonding wires (not shown); or, the electronic element 21 can directly contact the circuit layer 201. However, the manner in which the electronic element 21 is electrically connected to the carrier structure 20 is not limited to the above.

Furthermore, the antenna spacer 22 is a block made of glass or silicon material. In an embodiment, the antenna spacer 22 is of a chip specification such as a carrier chip. For example, the antenna spacer 22 can be attached onto the carrier structure 20 via a bonding layer 220 such as adhesive to cover the antenna layer 202.

Figure 3C:
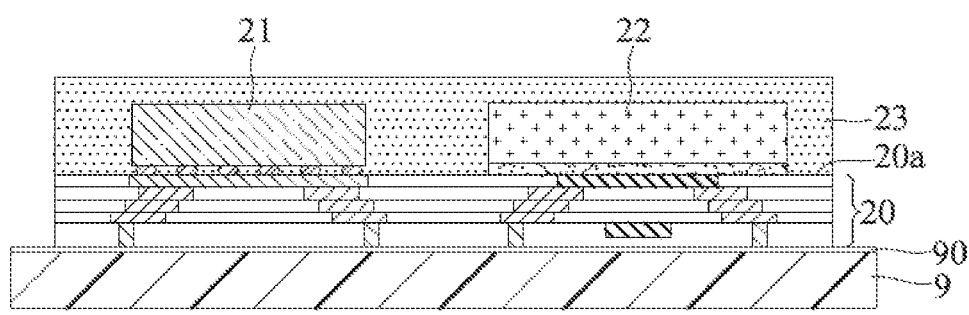

As shown in FIG. 3C, an encapsulation layer 23 is formed on the first side 20a of the carrier structure 20, so that the encapsulation layer 23 covers the electronic element 21 and the antenna spacer 22. In an embodiment, the encapsulation layer 23 is made from an insulating dielectric material, such as Ajinomoto build-up film (ABF), photosensitive resin, polyimide (PI), bismaleimide triazine (BT), flame resistant/retardant 5 prepreg (FR5 PP), dry film, epoxy resin, molding compound, epoxy molding compound (EMC), or other suitable materials, which can be formed on the first side 20a of the carrier structure 20 by means of lamination or molding.

Figure 3D:
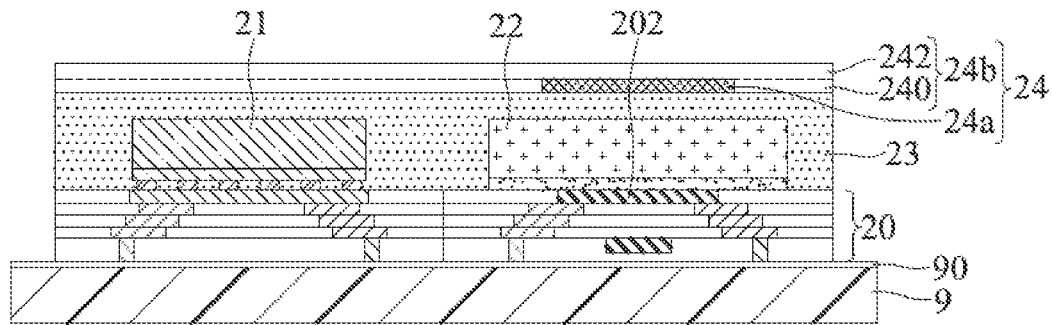

As shown in FIG. 3D, an antenna portion 24 is formed on the encapsulation layer 23, and the antenna portion 24 includes a dielectric layer 240 formed on the encapsulation layer 23 and an antenna body 24a formed on the dielectric layer 240. In an embodiment, the antenna body 24a is a patch antenna, which is adhered on the dielectric layer 240. In other embodiments, a metal layer may also be formed by electroplating, electroless plating, physical vapor deposition, sputtering, or other suitable methods to serve as the antenna body 24a.

Furthermore, the antenna body 24a and the antenna layer 202 are communicatively connected to each other (e.g., signal inductive coupling). For example, the position of the antenna body 24a corresponds to the position of the antenna spacer 22, that is, the two are opposite to each other up and down.

In addition, the encapsulation layer 23 and the dielectric layer 240 can be made of the same or different materials, which are not particularly limited.

In addition, the antenna portion 24 can be provided with an insulating protective layer 242 covering the antenna body 24a according to requirements, wherein the insulating protective layer 242 is made from a dielectric material and is formed on the dielectric layer 240. Therefore, the insulating protective layer 242 and the dielectric layer 240 can be seen as a whole, and serve as a covering body 24b to cover the antenna body 24a. It should be understood that the dielectric layer 240 can also be omitted, and the antenna body 24a is directly disposed on the encapsulation layer 23.

Figure 3E:
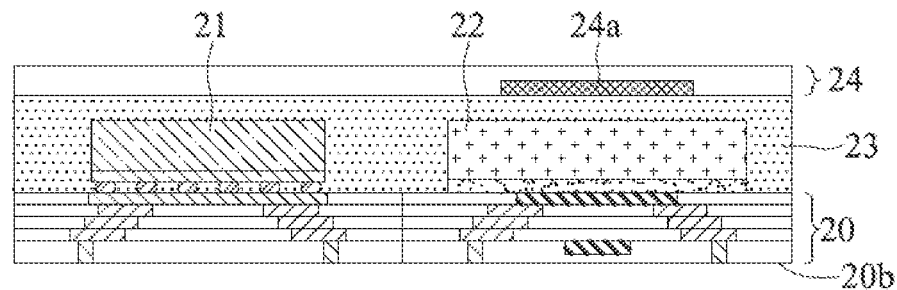

As shown in FIG. 3E, the support member 9 and the adhesive layer 90 thereon are removed to expose the second side 20b of the carrier structure 20. In an embodiment, the adhesive layer 90 can be a release film, so as to facilitate the removal of the support member 9.

Figure 3F:
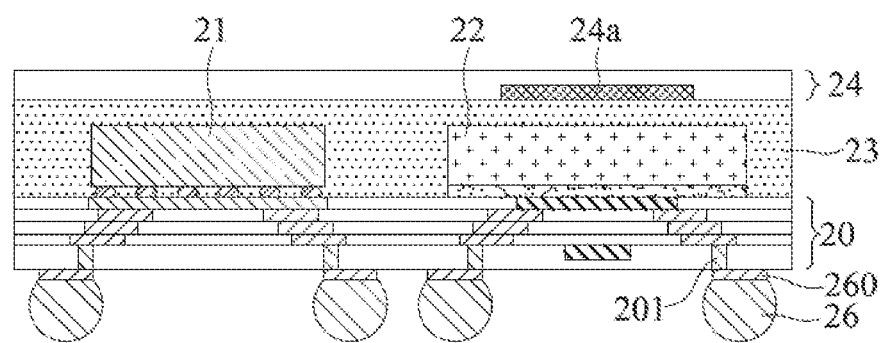

As shown in FIG. 3F, a plurality of conductive elements 26 such as solder balls are disposed on the second side 20b of the carrier structure 20 and are electrically connected to the circuit layer 201 of the carrier structure 20.

In an embodiment, a plurality of electrical contact pads 260 that are electrically connected to the circuit layer 201 can be formed on the second side 20b of the carrier structure 20 to bond to the conductive elements 26. The configuration of the electrical contact pads 260 is favorable for disposing the conductive elements 26.

Furthermore, the conductive elements 26 are only arranged on a portion of the electrical contact pads 260, such as a row as shown in FIG. 2.

Figure 3G:
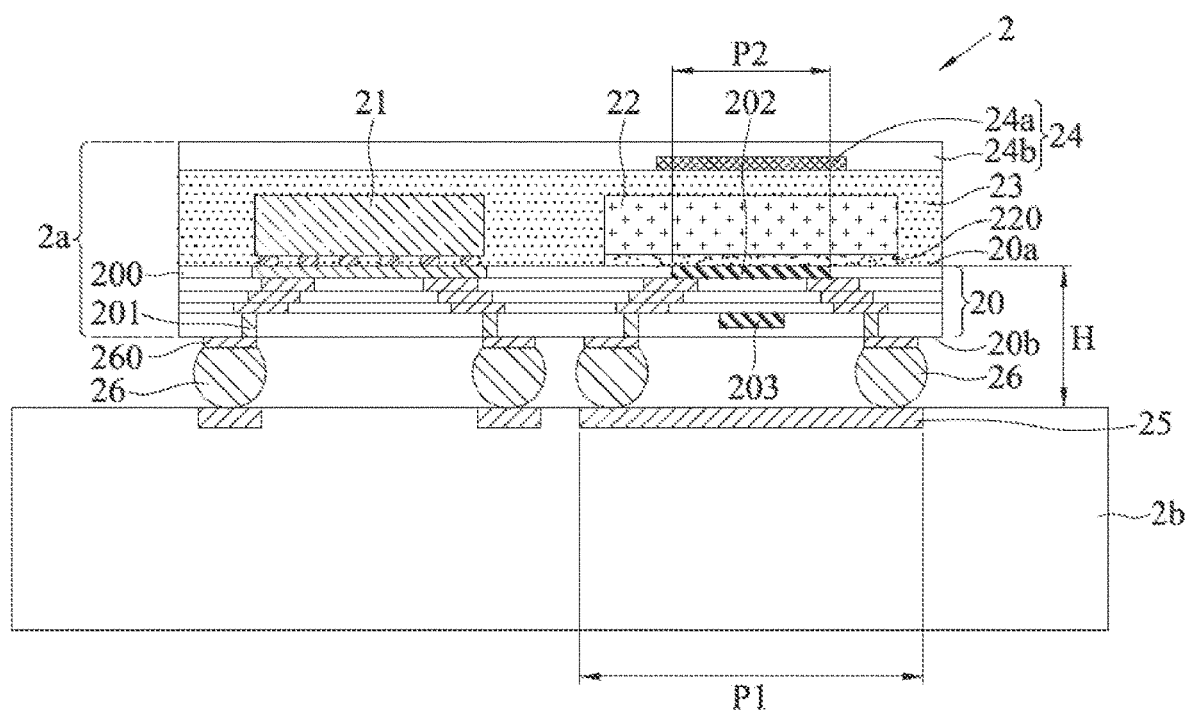

As shown in FIG. 3G, the carrier structure 20 is disposed on a circuit board 2b having at least one reflector 25 via the conductive elements 26, so that the circuit layer 201 of the carrier structure 20 is electrically connected to the circuit board 2b via the plurality of conductive elements 26, and the reflector 25 is communicatively connected to the antenna layer 202, so that the micro strip 203, the antenna layer 202, the antenna spacer 22, the antenna portion 24 and the reflector 25 serve as an antenna structure, wherein the antenna layer 202 serves as a coplanar waveguide (CPW) of the antenna structure, and is electrically connected to the reflector 25 of the circuit board 2b via the circuit layer 201 and the conductive elements 26 to ground the coplanar waveguide (CPW).

In an embodiment, the reflector 25 can be formed on the circuit board 2b by an RDL routing/wiring process, so that the reflector 25 is free from contacting the second side 20b of the carrier structure 20. Therefore, the distance H between the CPW and the reflector 25 will be increased by arranging the antenna layer 202 (coplanar waveguide) on the first side 20a of the carrier structure 20, so that the electronic device 2 can obtain better resonance effect and better antenna performance.

Furthermore, by disposing the reflector 25 on the circuit board 2b, the reflector 25 can effectively reflect the signal from the antenna body 24a of the antenna portion 24 through the antenna layer 202 of the carrier structure 20, so as to improve the signal directivity of the antenna body 24a, so that the radiation direction of the antenna body 24a can be in an ideal direction.

In addition, the reflector 25 and the antenna layer 202 are inductively coupled to each other. For example, the position of the reflector 25 corresponds to the position of the antenna layer 202, that is, the two are aligned up and down with respect to the second side 20b.

In addition, a width P1 of the reflector 25 is greater than a width P2 of the coplanar waveguide, thereby avoiding the problems of signal scattering and gain reduction.

Therefore, in the manufacturing method of the electronic device 2 of the present disclosure, the carrier structure 20, the antenna spacer 22, the antenna portion 24 and the reflector 25 are stacked up and down to form a three-dimensional antenna structure, so that during the manufacturing process, the carrier structure 20, the antenna spacer 22 and the antenna portion 24 can be integrally fabricated with the electronic element 21, that is, packaged together, so that the encapsulation layer 23 can cover the electronic element 21 and the antenna spacer 22. Therefore, the mold used in the packaging process can correspond to the size of the carrier structure 20, which is beneficial to the packaging process.

Furthermore, in the manufacturing method of the present disclosure, the antenna portion 24 and the electronic element 21 are disposed in the same antenna module 2a, so that the reflector 25 of the antenna structure only needs to communicatively connect with the radio-frequency chip (the electronic element 21) of any frequency of the antenna module 2a, and the antenna portion 24 of the electronic device 2 can emit 5G millimeter waves of the required frequency. Therefore, when mass-producing the electronic device 2, the manufacturing method of the present disclosure can produce radio-frequency products of various frequencies, thereby reducing the number of production lines to reduce production costs, and increasing production speed to increase productivity.

Furthermore, in the manufacturing method of the present disclosure, the antenna structure is fabricated by using a circuit substrate manufacturing process, so that the antenna structure can be fabricated by a packaging process during the manufacturing process, thereby facilitating packaging operations.

In addition, the 5G system requires more circuit configurations due to signal quality and transmission speed requirements to improve signal quality and transmission speed. The manufacturing method of the present disclosure utilizes the circuit substrate manufacturing process to manufacture the micro strip 203 and the antenna layer 202 of the carrier structure 20, so that the circuit routing/wiring space (number of layers) can be increased under the condition that the length and width of the carrier structure 20 are fixed, so as to increase the function of the antenna structure. Therefore, the electronic device 2 can provide the electrical functions required to operate the 5G system, that is, the electronic device 2 can meet the requirements of the antenna operation of the 5G system.

In addition, in the electronic device and the manufacturing method thereof of the present disclosure, a better antenna performance can be obtained by disposing the micro strip on the bottom layer of the carrier structure and disposing the coplanar waveguide on the top layer of the carrier structure, wherein the conductive elements are only provided on a portion of the electrical contact pads.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic device, comprising:
   a circuit board;
   a carrier structure having a first side and a second side opposing the first side, wherein the carrier structure is stacked on the circuit board via a plurality of conductive elements with the second side thereof;
   an antenna layer formed on the first side of the carrier structure;
   a micro strip disposed on the second side of the carrier structure, wherein a position of the antenna layer corresponds to a position of the micro strip;
   an encapsulation layer formed on the first side of the carrier structure;
   an antenna portion disposed on the encapsulation layer and communicatively connected to the antenna layer;
   an antenna spacer disposed on the first side of the carrier structure by corresponding to the position of the antenna layer and located between the antenna layer and the antenna portion, wherein the antenna spacer is embedded in the encapsulation layer; and
   a reflector directly contacting the circuit board, disposed on a side of the circuit board facing the carrier structure, and communicatively connected to the antenna layer.

2. The electronic device of claim 1, further comprising a plurality of electrical contact pads formed on the second side of the carrier structure, wherein the plurality of conductive elements are only disposed on a portion of the plurality of electrical contact pads.

3. The electronic device of claim 1, wherein the antenna layer is a coplanar waveguide, wherein a width of the reflector is greater than a width of the coplanar waveguide, and wherein the antenna layer is communicatively connected to the reflector via the plurality of conductive elements and a portion of a plurality of electrical contact pads.

4. The electronic device of claim 1, wherein the antenna portion comprises an antenna body communicatively connected to the antenna layer, wherein a position of the antenna body corresponds to a position of the antenna spacer, and wherein a position of the reflector corresponds to the position of the antenna layer.

5. The electronic device of claim 1, further comprising an electronic element disposed on the first side of the carrier structure and electrically connected to the carrier structure.

6. The electronic device of claim 5, wherein the carrier structure, the electronic element, the antenna spacer, the encapsulation layer and the antenna portion constitute an antenna module.

7. The electronic device of claim 1, wherein the carrier structure has a circuit layer.

8. The electronic device of claim 1, wherein the antenna spacer is a block made of glass or silicon material.

9. The electronic device of claim 1, wherein the encapsulation layer is made from an insulating dielectric material.

10. The electronic device of claim 1, wherein the reflector is free from contacting the second side of the carrier structure.

11. A method of manufacturing an electronic device, comprising:
    providing a carrier structure having a first side and a second side opposing the first side, wherein the first side of the carrier structure has an antenna layer formed thereon, and a micro strip is disposed on the second side of the carrier structure, and wherein a position of the antenna layer corresponds to a position of the micro strip;
    disposing an antenna spacer on the first side of the carrier structure;
    forming an encapsulation layer on the first side of the carrier structure, wherein the antenna spacer is embedded in the encapsulation layer;
    bonding an antenna portion communicatively connected to the antenna layer on the encapsulation layer on the first side of the carrier structure; and
    disposing the carrier structure onto a circuit board having a reflector with the second side of the carrier structure via a plurality of conductive elements, wherein the reflector directly contacts the circuit board, is disposed on a side of the circuit board facing the carrier structure, and is communicatively connected to the antenna layer.

12. The method of claim 11, further comprising forming a plurality of electrical contact pads on the second side of the carrier structure, wherein the plurality of conductive elements are only disposed on a portion of the plurality of electrical contact pads.

13. The method of claim 11, wherein the antenna layer is a coplanar waveguide, wherein a width of the reflector is greater than a width of the coplanar waveguide, and wherein the antenna layer is communicatively connected to the reflector via the plurality of conductive elements and a portion of a plurality of electrical contact pads.

14. The method of claim 11, wherein the antenna portion comprises an antenna body communicatively connected to the antenna layer, wherein a position of the antenna body corresponds to a position of the antenna spacer, and wherein a position of the reflector corresponds to the position of the antenna layer.

15. The method of claim 11, further comprising disposing an electronic element on the first side of the carrier structure, wherein the encapsulation layer covers the electronic element when the encapsulation layer is formed on the first side of the carrier structure.

16. The method of claim 15, wherein the carrier structure, the electronic element, the antenna spacer, the encapsulation layer and the antenna portion constitute an antenna module.

17. The method of claim 11, wherein the carrier structure has a circuit layer.

18. The method of claim 11, wherein the antenna spacer is a block made of glass or silicon material.

19. The method of claim 11, wherein the encapsulation layer is made from an insulating dielectric material.

20. The method of claim 11, wherein the reflector is formed on the circuit board via a redistribution layer routing process.

* * * * *